(12) United States Patent
Chen et al.

(10) Patent No.: US 12,727,301 B2
(45) Date of Patent: Sep. 1, 2026

(54) DISPLAY APPARATUS, DISPLAY PANEL AND DISPLAY BASEPLATE

(71) Applicants: Chengdu BOE Optoelectronics Technology Co., Ltd., Chengdu (CN); BOE Technology Group Co., Ltd., Beijing (CN)

(72) Inventors: Jing Chen, Beijing (CN); Puyu Qi, Beijing (CN); Yanhong Ding, Beijing (CN); Shuai Xie, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/038,693

(22) PCT Filed: Apr. 20, 2022

(86) PCT No.: PCT/CN2022/087865
§ 371 (c)(1),
(2) Date: May 24, 2023

(87) PCT Pub. No.: WO2023/201560
PCT Pub. Date: Oct. 26, 2023

(65) Prior Publication Data

US 2025/0040319 A1 Jan. 30, 2025

(51) Int. Cl.
*H10H 20/855* (2025.01)

(52) U.S. Cl.
CPC .................................. *H10H 20/855* (2025.01)

(58) Field of Classification Search
CPC .. H01L 25/167; H10H 20/855; H10K 59/879; H10K 59/8792
USPC ....................................... 257/79, 88–89, 100
See application file for complete search history.

(56) References Cited

U.S. PATENT DOCUMENTS 10,914,977 B1 2/2021 Hsu et al.
2003/0183019 A1 10/2003 Chae
2012/0199859 A1 8/2012 Shikina et al.
2017/0286743 A1 10/2017 Lee et al.
2019/0251318 A1* 8/2019 Jung .................. G06V 40/1306
(Continued)

FOREIGN PATENT DOCUMENTS

CN 102629622 A 8/2012
CN 110361888 A 10/2019
(Continued)

OTHER PUBLICATIONS

PCT/CN2022/087865 international search report.
PCT/CN2022/087865 Written Opinion.

*Primary Examiner* — Ratisha Mehta
*Assistant Examiner* — Mikka Liu
(74) *Attorney, Agent, or Firm* — IPro, PLLC

(57) ABSTRACT

Provided are a display apparatus, a display panel and a display baseplate. The display baseplate includes: a substrate; a light-blocking layer on the substrate, and including light-transmitting holes; a first light-adjusting layer at a side of the light-blocking layer; and first light-focusing bodies at a surface of the first light-adjusting layer away from the light-blocking layer, where a refractive index of the first light-adjusting layer is different from a refractive index of each of the first light-focusing bodies. In this way, use effect can be improved.

19 Claims, 8 Drawing Sheets

(56) References Cited

U.S. PATENT DOCUMENTS

| | | | | |
|---|---|---|---|---|
| 2019/0371866 | A1* | 12/2019 | Kim | H10K 59/879 |
| 2021/0210557 | A1* | 7/2021 | Lim | H10K 59/879 |
| 2021/0225948 | A1 | 7/2021 | Liu et al. | |
| 2021/0296409 | A1 | 9/2021 | Yamazaki et al. | |
| 2021/0376003 | A1 | 12/2021 | Xu et al. | |
| 2022/0075985 | A1 | 3/2022 | Zhu et al. | |
| 2022/0077431 | A1* | 3/2022 | Lee | H10K 59/8792 |
| 2023/0200184 | A1 | 6/2023 | Wang | |

FOREIGN PATENT DOCUMENTS

| | | | |
|---|---|---|---|
| CN | 111209803 | A | 5/2020 |
| CN | 111599846 | A | 8/2020 |
| CN | 111668284 | A | 9/2020 |
| CN | 112070002 | A | 12/2020 |
| CN | 112530999 | A | 3/2021 |
| CN | 112882279 | A | 6/2021 |
| CN | 112904609 | A | 6/2021 |
| CN | 112989885 | A | 6/2021 |
| CN | 113206208 | A | 8/2021 |
| CN | 113219691 | A | 8/2021 |
| CN | 113363305 | A | 9/2021 |
| CN | 113363403 | A | 9/2021 |
| CN | 114141837 | A | 3/2022 |

* cited by examiner

DISPLAY APPARATUS, DISPLAY PANEL AND DISPLAY BASEPLATE

CROSS-REFERENCE TO RELATED APPLICATIONS

This application is a national stage of international PCT Application No. PCT/CN2022/087865 filed on Apr. 20, 2022, the entire contents of which are incorporated herein by reference.

TECHNICAL FIELD

The present disclosure relates to the field of display technologies, and in particular to a display apparatus, a display panel and a display baseplate.

BACKGROUND

Along with the fast development of society, display panels have drawn more and more attention of people. At present, with the popularization of full-screen, the display panels with an under-screen light-sensing device gradually become the mainstream. However, the use effect of the display panels is poor.

SUMMARY

The present disclosure is to provide a display apparatus, a display panel and a display baseplate so as to improve use effect.

According to an aspect of the present disclosure, a display baseplate is provided, including:

a substrate;

a light-blocking layer, on the substrate and including light-transmitting holes;

a first light-adjusting layer, at a side of the light-blocking layer; and first light-focusing bodies, at a surface of the first light-adjusting layer away from the light-blocking layer, where a refractive index of the first light-adjusting layer is different from a refractive index of each of the first light-focusing bodies.

Furthermore, a surface of each of the first light-focusing bodies facing the first light-adjusting layer is a curved surface protruding toward the light-blocking layer; the refractive index of the first light-adjusting layer is less than the refractive index of each of the first light-focusing bodies, and the first light-focusing bodies are configured to focus light incident to the light-blocking layer.

Furthermore, the refractive index of the first light-adjusting layer is 1.6 to 1.9, and/or, the refractive index of each of the first light-focusing bodies is 1.4 to 1.55.

Furthermore, along a direction perpendicular to the substrate, each of the first light-focusing bodies has a thickness of 2 μm to 5 μm.

Furthermore, an orthographic projection of each of the first light-focusing bodies on the substrate has an arc-shaped edge, and a length of the orthographic projection along a direction parallel to the substrate is 1 μm to 5 μm.

Furthermore, the surface of each of the first light-focusing bodies facing the first light-adjusting layer is a curved surface recessed away from the light-blocking layer, and the refractive index of the first light-adjusting layer is greater than the refractive index of each of the first light-focusing bodies.

Furthermore, the surface of each of the first light-focusing bodies facing the first light-adjusting layer is a plane or an approximate plane, and the refractive index of the first light-adjusting layer is greater than the refractive index of each of the first light-focusing bodies.

Furthermore, the first light-focusing bodies are in one-to-one correspondence with the light-transmitting holes, and an orthographic projection of one of the first light-focusing bodies on the substrate at least partially overlaps an orthographic projection of one of the light-transmitting holes corresponding to the one of the first light-focusing bodies on the substrate.

Furthermore, the orthographic projection of the one of the light-transmitting holes on the substrate is located within the orthographic projection of the one of the first light-focusing bodies on the substrate.

Furthermore, the surface of the first light-adjusting layer away from the light-blocking layer is provided with recesses in which the first light-focusing bodies are disposed respectively.

Furthermore, the first light-focusing bodies are in light-focusing units spaced apart, at least one of light-focusing units includes a multiple of the first light-focusing bodies, and the light-focusing units are in one-to-one correspondence with the light-transmitting holes.

Furthermore, the display baseplate further includes:

a light emitter at a side of the substrate, where the light-blocking layer is at a side of the light emitter away from the substrate, and the first light-adjusting layer is at a side of the light-blocking layer away from the substrate; and a color film layer, including color resistance blocks and a black matrix surrounding the color resistance blocks, where the color film layer forms the light-blocking layer and the light-transmitting holes are disposed in the black matrix.

Furthermore, orthographic projections of the first light-focusing bodies on the substrate and orthographic projections of the color resistance blocks on the substrate do not overlap.

Furthermore, the light emitter includes sub-pixels, and orthographic projections of the first light-focusing bodies on the substrate and orthographic projections of the sub-pixels on the substrate do not overlap.

Furthermore, the display baseplate further includes:

a light emitter on the substrate; and second light-focusing bodies on a light-emitting side of the light emitter, and configured to focus light emitted by the light emitter, and orthographic projections of the first light-focusing bodies on the substrate and orthographic projections of the second light-focusing bodies on the substrate do not overlap.

Furthermore, the first light-adjusting layer is located at the light-emitting side of the light emitter, and the first light-focusing bodies are at a side of the first light-adjusting layer away from the light emitter; wherein the second light-focusing bodies are at a surface of the first light-adjusting layer facing the light emitter, a surface of each of the second light-focusing bodies facing the first light-adjusting layer is a curved surface protruding away from the light emitter, and the refractive index of the first light-adjusting layer is less than a refractive index of each of the second light-focusing bodies.

Furthermore, the first light-adjusting layer is at the light-emitting side of the light emitter, and the first light-focusing bodies are at a side of the first light-adjusting layer away from the light emitter; wherein the second light-focusing bodies are at a surface of the first light-adjusting layer facing the light emitter, and the refractive index of the first light-adjusting layer is greater than a refractive index of each of the second light-focusing bodies; and a surface of each of the second light-focusing bodies facing the first light-adjusting layer is a plane or a curved surface recessed toward the light emitter.

Furthermore, the light emitter is between the light-blocking layer and the substrate, and the first light-adjusting layer is at a side of the light-blocking layer away from the substrate, and the display baseplate further includes:

a planarization layer at the light-emitting side of the light emitter, where the second light-focusing bodies are at a surface of the planarization layer away from the light emitter, and the first light-adjusting layer covers the planarization layer and the second light-focusing bodies; and a color film layer, including color resistance blocks and a black matrix surrounding the color resistance blocks, where the color film layer forms the light-blocking layer and the light-transmitting holes are disposed in the black matrix;

where the planarization layer covers the color film layer.

Furthermore, the first light-adjusting layer is at the light-emitting side of the light emitter, and the first light-focusing bodies and the second light-focusing bodies are at a side of the first light-adjusting layer away from the light emitter; and the display baseplate includes:

a second light-adjusting layer, covering the first light-adjusting layer, the first light-focusing bodies and the second light-focusing bodies; where a surface of each of the second light-focusing bodies facing the second light-adjusting layer is a curved surface protruding away from the light emitter, and a refractive index of the second light-adjusting layer is less than a refractive index of each of the second light-focusing bodies.

Furthermore, the first light-adjusting layer is at the light-emitting side of the light emitter, and the first light-focusing bodies and the second light-focusing bodies are disposed at a side of the first light-adjusting layer away from the light emitter; and the display baseplate includes:

a second light-adjusting layer, covering the first light-adjusting layer, the first light-focusing bodies and the second light-focusing bodies; where a refractive index of the second light-adjusting layer is greater than a refractive index of each of the second light-focusing bodies;

a surface of each of the second light-focusing bodies facing the second light-adjusting layer is a plane or an approximate plane; or, the surface of each of the second light-focusing bodies facing the second light-adjusting layer is a curved surface recessed toward the light emitter.

Furthermore, the first light-focusing bodies and the second light-focusing bodies are located at both sides of the light-blocking layer correspondingly one-to-one, and the display baseplate further includes:

a second light-adjusting layer at the light-emitting side of the light emitter, and the light-blocking layer is at a side of the second light-adjusting layer away from the light emitter;

where the second light-focusing bodies are at a surface of the second light-adjusting layer facing the light emitter, the surface of each of the second light-focusing bodies facing the second light-adjusting layer is a curved surface protruding away from the light emitter, and a refractive index of the second light-adjusting layer is less than a refractive index of each of the second light-focusing bodies.

Furthermore, the first light-focusing bodies and the second light-focusing bodies are located at both sides of the light-blocking layer correspondingly one-to-one, and the display baseplate includes:

a second light-adjusting layer at the light-emitting side of the light emitter, where the light-blocking layer is at a side of the second light-adjusting layer away from the light emitter; the second light-focusing bodies are at a surface of the second light-adjusting layer facing the light emitter, and a refractive index of the second light-adjusting layer is greater than a refractive index of each of the second light-focusing bodies;

a surface of each of the second light-focusing bodies facing the second light-adjusting layer is a plane or an approximate plane; or, a curved surface recessed toward the light emitter.

Furthermore, the first light-adjusting layer includes a photoresist, and the first light-focusing bodies include a transparent ink.

According to an aspect of the present disclosure, a display panel is provided, including:

the display baseplate; and a light-sensing device, at a side of the light-blocking layer away from the first light-adjusting layer.

According to an aspect of the present disclosure, there is provided a display apparatus, including the display panel.

In the embodiments of the present disclosure, when the display apparatus, the display panel and the display baseplate are applied to a display panel with an under-screen light-sensing device respectively, first light-focusing bodies are at a surface of the first light-adjusting layer away from the light-blocking layer, where a refractive index of the first light-adjusting layer is different from a refractive index of each of the first light-focusing bodies. The first light-focusing bodies are configured to focus light incident to the light-blocking layer such that the light under a large view angle and incident to the light-blocking layer is changed into light under a narrow view angle, helping increase a luminous flux of the light-transmitting holes. Further, light information obtained by the under-screen light-sensing device can be increased, and the sensitivity of the light-sensing device can be enhanced, thus improving the use effect. Moreover, the influence of ambient light is weakened and the influence of background noise generated by ambient light in the light-sensing device can be reduced, helping to achieve full-screen design.

Figure 1:
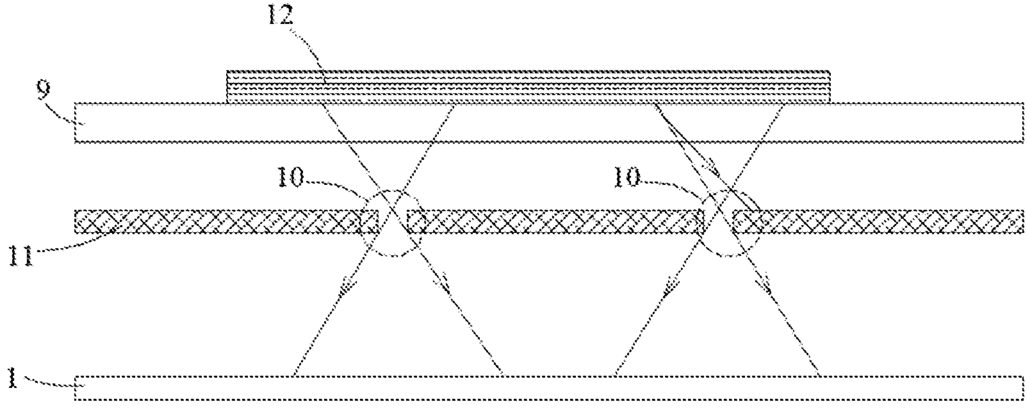
FIG. 1 is a schematic diagram illustrating a fingerprint identification process in the related arts.

Reference numerals are described below: 1. light-sensing device, 2. substrate, 3. drive circuit layer, 4. light emitter, 401. sub-pixel, 402. pixel definition layer, 5. encapsulation layer, 6. color film layer, 601. color resistance block, 602. black matrix, 7. first light-adjusting layer, 8. first light-focusing body, 9. cover plate, 10. light-transmitting hole, 11. light-blocking layer, 12. trigger object, 13. second light-adjusting layer, 14. second light-focusing body, 15. planarization layer, 16. buffer layer, 17. light-focusing unit.

DETAILED DESCRIPTION OF THE EMBODIMENTS

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses consistent with some aspects of the present disclosure as detailed in the appended claims.

The terms used herein are used to only describe a particular embodiment rather than limit the present disclosure. Unless otherwise defined, technical terms or scientific terms used in the present disclosure should have general meanings that can be understood by persons of ordinary skill in the art. "First", "second" and the like used in the specification and claims do not represent any sequence, quantity or importance, but distinguish different components. Similarly, "one" or "a" and the like do not represent quantity limitation but represent at least one. "Multiple" or "a plurality" represents two or more. The terms "include" or "comprise" or the like is intended to refer to that an element or object appearing before "include" or "comprise" covers an element or object or its equivalents listed after "include" or "comprise" and does not preclude other elements or objects. "Connect" or "connect with" or the like is not limited to physical or mechanical connection but includes direct or indirect electrical connection. The singular forms such as "a", "an", and "the" used in the present disclosure and the appended claims are also intended to include plural forms, unless the context clearly indicates otherwise. It is also to be understood that the term "and/or" as used herein refers to and includes any or all possible combinations of one or more associated listed items.

In the related arts, as shown in FIG. 1, a display panel with fingerprint identification function includes a light-sensing device 1 and a light-blocking layer 11, where the light-blocking layer 11 is provided with light-transmitting holes 10. When a finger serving as a trigger object is placed on a fingerprint identification region of a cover plate 9, light emitted by the display panel can be irradiated onto the finger through the cover plate 9 and then reflected to the light-sensing device 1. Fingerprint features are processed by light path modulation and image splicing software and finally formed into a digitized image which can be processed by a fingerprint device algorithm. Since the light-transmitting holes 10 are small in size, when an angle of an imaging field of view is large, some light cannot run through the light-transmitting holes 10, leading to insufficient luminous flux and hence a blurred image. Furthermore, when a distance between the light-blocking layer 11 and the cover plate 9 becomes smaller and a distance between the light-blocking layer 11 and the light-sensing device 1 becomes larger, an image distance of pinhole imaging is increased while an object distance is decreased. As a result, coincidence of the object field of view fails and the light-sensing device 1 cannot capture complete fingerprint information, thus reducing sensitivity. It is to be noted that the above solution in the prior arts does not constitute any limitation to the present disclosure.

Figure 2:
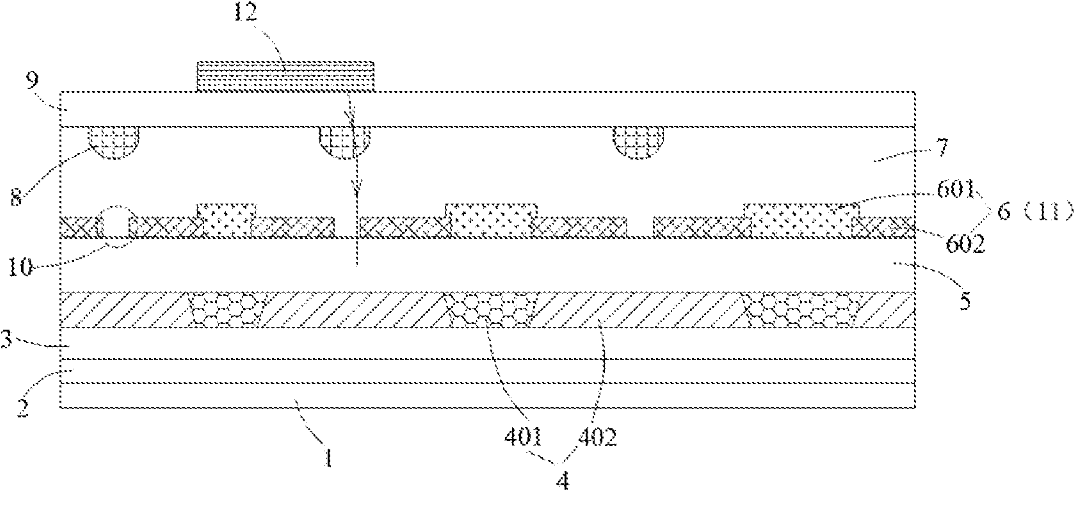
FIGS. 2-6 are schematic diagrams illustrating a display baseplate according to embodiments of the present disclosure.
Figure 7:
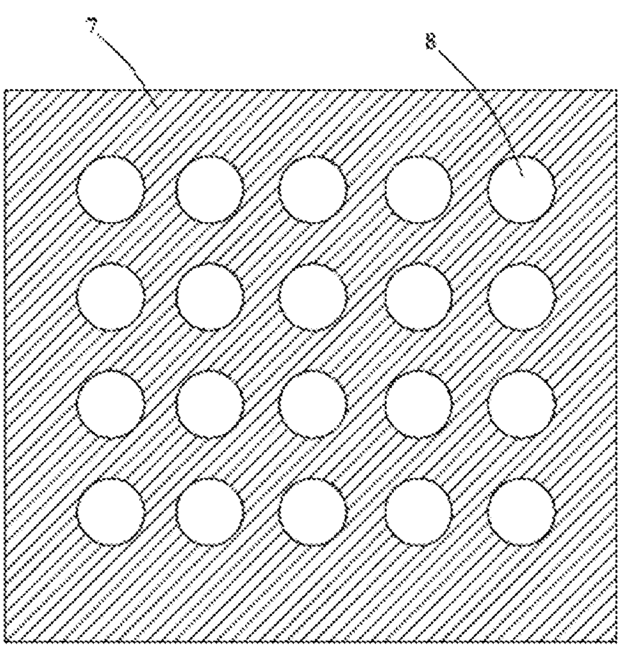
FIG. 7 is a schematic diagram illustrating first light-focusing bodies and a first light-adjusting layer in a display baseplate according to an embodiment of the present disclosure.

An embodiment of the present disclosure provides a display baseplate. As shown in FIGS. 2 and 7, the display baseplate may include a substrate 2, a light-blocking layer 11, a first light-adjusting layer 7, and first light-focusing bodies 8.

The light-blocking layer 11 is disposed on the substrate 2. Light-transmitting holes 10 are disposed in the light-blocking layer 11. The first light-adjusting layer 7 is at a side of the light-blocking layer 11. The first light-focusing bodies 8 are at a surface of the first light-adjusting layer 7 away from the light-blocking layer 11. A refractive index of the first light-adjusting layer 7 is different from a refractive index of each of the first light-focusing bodies 8.

In an embodiment of the present disclosure, when the display baseplate is applied to a display panel with an under-screen light-sensing device 1, the first light-focusing bodies 8 are at a surface of the first light-adjusting layer 7 away from the light-blocking layer 11, where a refractive index of the first light-adjusting layer 7 is different from a refractive index of each of the first light-focusing bodies 8. The first light-focusing bodies 8 are configured to focus light incident to the light-blocking layer 11 so as to change light under a large view angle and incident to the light-blocking layer into light under a narrow view angle, helping increase the luminous flux of the light-transmitting holes 10. Further, light information obtained by the under-screen light-sensing device 1 can be increased, and the sensitivity of the light-sensing device 1 can be enhanced, thus improving the use effect. Moreover, the influence of background noise generated by ambient light in the light-sensing device 1 can be reduced, helping to achieve full-screen design.

The various parts of the display baseplate in the embodiments of the present disclosure will be described below.

As shown in FIG. 2, the substrate 2 may be a rigid substrate. The rigid substrate may be a glass substrate, a Polymethyl methacrylate (PMMA) substrate or the like. Certainly, the substrate 2 may also be a flexible substrate, which may be a Polyethylene terephthalate (PET) substrate, a Polyethylene naphthalate two formic acid glycol ester (PEN) substrate, or a Polyimide (PI) substrate.

Figure 6:
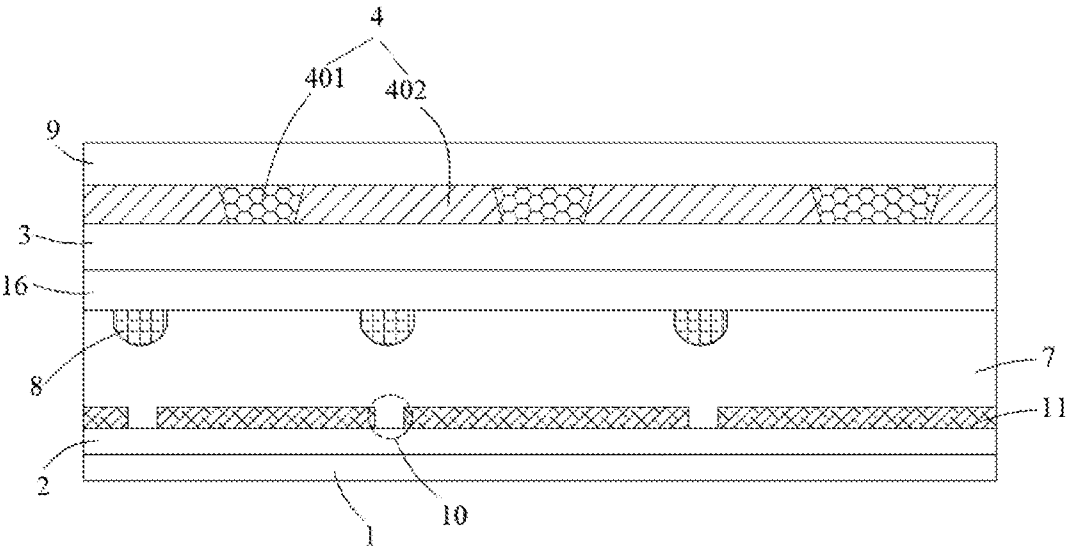

As shown in FIG. 2, a drive circuit layer 3 may also be disposed on the substrate 2. The drive circuit layer 3 may include a plurality of drive transistors. These drive transistors may be thin film transistors, which is not limited in the embodiments of the present disclosure. The thin film transistors may be top-gate thin film transistors, or bottom-gate thin film transistors. As an example, the thin film transistors are the top-gate thin film transistors, the drive circuit layer 3 may include an active layer, a gate insulation layer, a gate electrode, an interlayer insulation layer, a source electrode and a drain electrode. The active layer may be disposed on the substrate 2. The gate insulation layer may be at a side of the active layer away from the substrate 2. The gate electrode may be at a side of the gate insulation layer away from the substrate 2. The interlayer insulation layer may be disposed on the gate insulation layer and covered on the gate electrode. The source electrode and the drain electrode may be disposed on the interlayer insulation layer and connected to the active layer through a via hole penetrating through the interlayer insulation layer and the gate insulation layer. Furthermore, as shown in FIG. 6, a buffer layer 16 may also be disposed on the substrate 2, where the buffer layer 16 may be between the substrate 2 and the drive circuit layer 3.

As shown in FIG. 2, the display baseplate in the present disclosure may further include a light emitter 4. The light emitter 4 may be at a side of the drive circuit layer 3 away from the substrate 2. The light emitter 4 may include a plurality of sub-pixels 401 and a pixel definition layer 402 surrounding the sub-pixels 401. The sub-pixels 401 may include one or more red sub-pixels, one or more blue sub-pixels and one or more green sub-pixels. The sub-pixels 401 may include an anode layer, a light-emitting material layer and a cathode layer laminated one after another. The pixel definition layer 402 may be provided with pixel openings. A quantity of the pixel openings is more than one. A plurality of pixel openings are distributed in an array. The sub-pixels 401 may be disposed in the pixel openings respectively. Specifically, the anode layers of the sub-pixels 401 may be disposed in the pixel openings and connected with the source electrodes or drain electrodes of the drive transistors, the light-emitting material layers may be at a side of the anode layers away from a drive backplate, and the cathode layers may be at a side of the light-emitting material layers away from the anode layers.

As shown in FIG. 2, the display baseplate in the present disclosure may further include a color film layer 6 and an encapsulation layer 5. The color film layer 6 may be disposed on a side of the light emitter 4 away from the substrate 2. The color film layer 6 may include color resistance blocks 601 and a black matrix 602 surrounding the color resistance blocks 601. Color resistance openings are disposed on the black matrix 602 and the color resistance blocks 601 are disposed in the color resistance openings. A quantity of the color resistance openings is more than one. A plurality of color resistance blocks 601 may include one or more red color resistance blocks, one or more blue color resistance blocks and one or more green color resistance blocks. The red color resistance blocks may correspond to the above red sub-pixels, the blue color resistance blocks may correspond to the above blue sub-pixels, and the green color resistance blocks may correspond to the above green sub-pixels. The encapsulation layer 5 may be disposed on a side of the light emitter 4 away from the substrate 2. The encapsulation layer 5 may be a thin film encapsulation layer (TFE), which is not limited in the embodiments of the present disclosure. The encapsulation layer 5 may be located between the color film layer 6 and the light emitter 4, or located at a side of the color film layer 6 away from the light emitter 4.

As shown in FIG. 2, the light-blocking layer 11 may be disposed on a side of the light emitter 4 away from the substrate 2. Light-transmitting holes 10 arranged in a spacing are disposed in the blocking layer 11. The light-transmitting holes 10 are penetrated through the light-blocking layer 11 along a thickness direction of the light-blocking layer 11. The light-transmitting holes 10 may be round holes, elliptical holes, rectangular holes, square holes, triangular holes, trapezoidal holes, polygonal holes, etc. Certainly, the light-transmitting holes 10 may also be irregular-shaped holes. The shapes of the light-transmitting holes 10 may be same or different, and the areas of the light-transmitting holes 10 may be same or different. For example, when the light-transmitting holes 10 are round holes, the light-transmitting hole 10 may have a diameter of 1 μm to 25 μm, such as 1 μm, 6 μm, 12 μm, 19 μm, 25 μm, etc. Furthermore, the light-transmitting hole 10 may have a diameter of 1 μm to 5 μm, for example, 1 μm, 2 μm, 3 μm, 4 μm, 5 μm or the like. The light-transmitting holes 10 are distributed in an array on the light-blocking layer 11. In addition, the light-transmitting holes 10 may be disposed in a partial region of the light-blocking layer 11, which is not limited herein. Alternatively, the light-transmitting holes 10 may be disposed in the entire region of the light-blocking layer 11. The light-blocking layer 11 may be formed of the above color film layer 6, which is not limited herein. The light-transmitting holes 10 may be disposed in the black matrix 602 of the color film layer 6. The area of each of the light-transmitting holes 10 may be less than the area of each of the above color resistance openings, which is not limited herein. In another embodiment of the present disclosure, as shown in FIG. 6, the light-blocking layer 11 may be between the light emitter 4 and the substrate 2. Specifically, the light-blocking layer 11 may be between the above drive circuit layer 3 and the substrate 2. Furthermore, the light-blocking layer 11 may be between the above buffer layer 16 and the substrate 2. In other implementations of the present disclosure, the light-blocking layer 11 may be disposed on a side of the substrate 2 away from the light emitter 4, and for this reason, the substrate 2 needs to be disposed as a transparent/light-transmitting substrate.

As shown in FIG. 2, the first light-adjusting layer 7 may be disposed on a side of the light-blocking layer 11 away from the substrate 2. The first light-focusing bodies 8 are at a surface of the first light-adjusting layer 7 away from the light-blocking layer 11. Along a direction perpendicular to the substrate 2, the first light-focusing body 8 may have a thickness of 2 μm to 5 μm, for example, 2 μm, 3 μm, 4 μm, 5 μm, etc. Furthermore, the first light-focusing body 8 may have a maximum size of 2 μm to 5 μm along a thickness direction of the substrate 2. An orthographic projection of each of the first light-focusing bodies 8 on the substrate 2 may be circular, elliptical, gourd-shaped, rectangular, square, triangular, trapezoidal and polygonal, etc. Of course, the orthographic projection may also be in an irregular shape. When the orthographic projection of each of the first light-focusing bodies 8 on the substrate 2 is circular, elliptical, or gourd-shaped, the orthographic projection of the first light-focusing body 8 on the substrate 2 has an arc-shaped edge. A length of the orthographic projection of each of the first light-focusing bodies 8 on the substrate 2 along a direction parallel to the substrate 2 may be in a range from 1 μm to 5 μm. As shown in FIG. 7, when the orthographic projection of the first light-focusing body 8 on the substrate 2 is circular, the orthographic projection has a diameter of 1 μm to 9 μm, for example, 1 μm, 2 μm, 3 μm, 4 μm, 5 μm, 7 μm, 8 μm, 9 μm, etc. Furthermore, the diameter of the orthographic projection may be 1 μm to 5 μm. Moreover, the first light-adjusting layer 7 may include a photoresist. Specifically, the first light-adjusting layer 7 is made of the photoresist.

As shown in FIG. 2, a surface of the first light-adjusting layer 7 away from the light-blocking layer 11 may be provided with recesses in which the first light-focusing bodies 8 are disposed respectively. A surface of the first light-focusing body 8 away from the light-blocking layer 11 may be a plane or an approximate plane, that is, the surface of the first light-focusing body 8 away from the light-blocking layer 11 is parallel to or substantially parallel to the substrate 2, and a region outside the recesses on the surface of the first light-adjusting layer 7 away from the light-blocking layer 11 is flushed with the surface of the first light-focusing body 8 away from the light-blocking layer 11. The display baseplate in the present disclosure may further include a cover plate 9. "Approximate plane" in the present disclosure refers to "an included angle of the plane and the substrate 2 is less than or equal to 15°". The cover plate 9 may be disposed on a side of the first light-adjusting layer 7 away from the substrate 2. The first light-focusing bodies 8 may be in one-to-one correspondence with the light-transmitting holes 10 in the light-blocking layer 11. The orthographic projection of the first light-focusing body 8 on the substrate 2 at least partially overlaps the orthographic projection of the corresponding light-transmitting hole 10 on the substrate 2. Furthermore, the orthographic projection of the light-transmitting hole 10 on the substrate 2 is located within the orthographic projection of the first light-focusing body 8 on the substrate 2, namely, an area of the orthographic projection of the light-transmitting hole 10 on the substrate 2 is smaller than an area of the orthographic projection of the corresponding first light-focusing body 8 on the substrate 2. Furthermore, the orthographic projections of the first light-focusing bodies 8 on the substrate 2 and the orthographic projections of the sub-pixels 401 on the substrate 2 are alternately disposed in a spacing. The orthographic projections of the first light-focusing bodies 8 on the substrate 2 and the orthographic projections of the above color resistance blocks 601 on the substrate 2 may be disposed in a spacing. The first light-focusing bodies 8 may include a transparent ink. Specifically, the first light-focusing bodies 8 are made of the transparent ink. The first light-focusing bodies 8 may be formed by an ink jet printing process. The first light-focusing bodies 8 are configured to focus light incident to the light-blocking layer 11.

Figure 5:
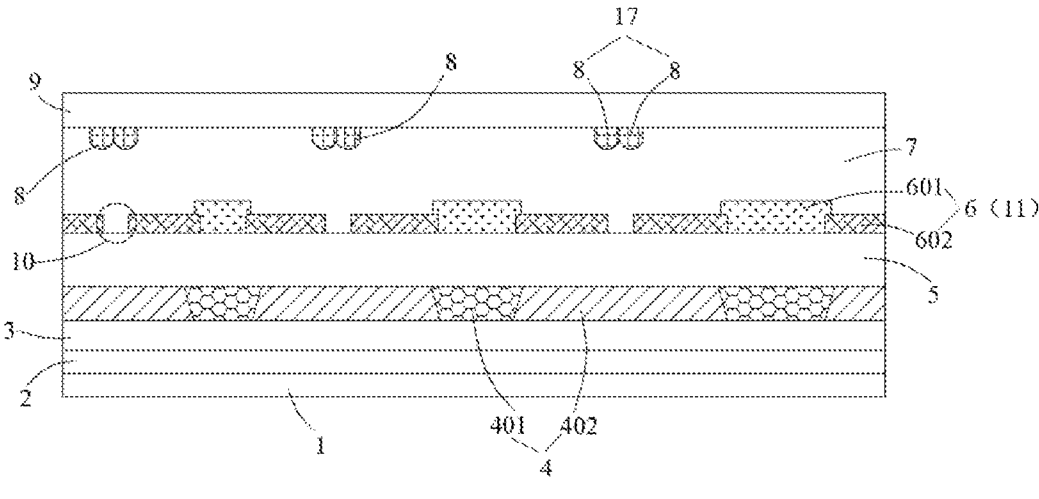

In other embodiments of the present disclosure, as shown in FIG. 5, the first light-focusing bodies 8 are in light-focusing units 17 spaced apart. At least one of the light-focusing units 17 includes a multiple of the first light-focusing bodies 8. Light-focusing units 17 are in one-to-one correspondence with the light-transmitting holes 10. An orthographic projection of the light-focusing unit 17 on the substrate 2 at least partially overlaps the orthographic projection of the corresponding light-transmitting hole 10 on the substrate 2. Furthermore, the orthographic projection of the light-transmitting hole 10 on the substrate 2 is located within the orthographic projection of the corresponding light-focusing unit 17 on the substrate 2.

Figure 3:
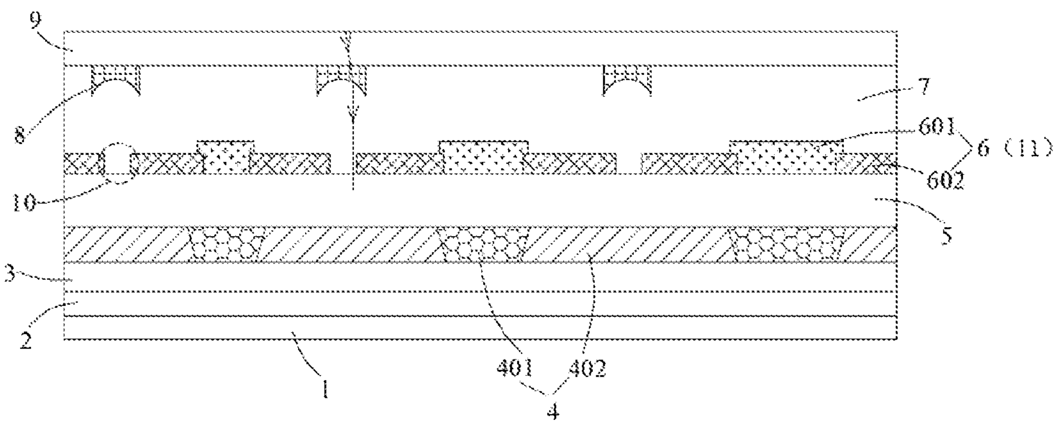
Figure 4:
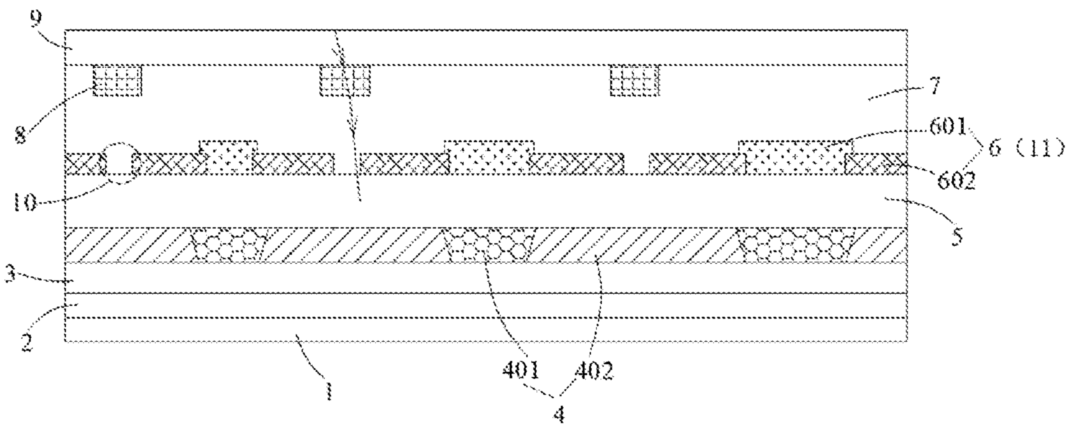

The refractive index of the first light-adjusting layer 7 is different from the refractive index of the first light-focusing body 8. In an embodiment of the present disclosure, as shown in FIG. 2, the refractive index of the first light-adjusting layer 7 is less than the refractive index of the first light-focusing body 8. A surface of the first light-focusing body 8 facing the first light-adjusting layer 7 is an outwardly-protruding curved surface, namely, the surface of the first light-focusing body 8 facing the first light-adjusting layer 7 is protruded to a direction close to the light-blocking layer 11, in other words, a center of curvature of the curved surface is located at a side of the curved surface away from the light-blocking layer 11. The refractive index of the first light-adjusting layer 7 may be 1.4 to 1.55, for example, 1.4, 1.45, 1.5, 1.55, etc., and the refractive index of the first light-focusing body 8 may be 1.6 to 1.9, for example, 1.6, 1.7, 1.8, 1.9, etc. In another embodiment of the present disclosure, as shown in FIG. 4, the refractive index of the first light-adjusting layer 7 may be greater than the refractive index of the first light-focusing body 8, and the surface of the first light-focusing body 8 facing the first light-adjusting layer 7 is a plane or an approximate plane. In other embodiments of the present disclosure, as shown in FIG. 3, the refractive index of the first light-adjusting layer 7 is greater than the refractive index of the first light-focusing body 8, and the surface of the first light-focusing body 8 facing the first light-adjusting layer 7 is an inwardly-recessed curved surface, namely, the surface of the first light-focusing body 8 facing the first light-adjusting layer 7 is recessed to a direction away from the light-blocking layer 11, in other words, a center of curvature of the curved surface is located at a side of the curved surface close to the light-blocking layer 11.

Figure 8:
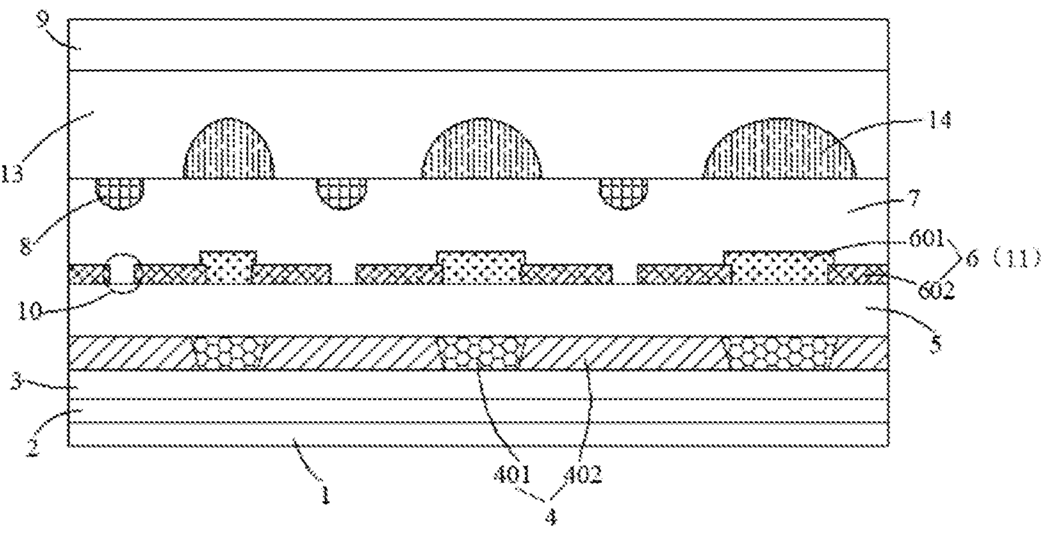
FIGS. 8-17 are schematic diagrams illustrating a display baseplate with second light-focusing bodies according to embodiments of the present disclosure.

As shown in FIG. 8, the display baseplate in the present disclosure may further include second light-focusing bodies 14. The second light-focusing bodies 14 may be disposed at a light-emitting side of the light emitter 4, and configured to focus light emitted by the light emitter 4 so as to improve the light-emitting efficiency of the light emitter 4. The light-emitting side of the light emitter 4 may be a side of the light emitter 4 away from the substrate 2. Certainly, the light-emitting side of the light emitter 4 may also be a side of the light emitter 4 facing the substrate 2. The second light-focusing body 14 may have a thickness of 1 μm to 5 μm, for example, 1 μm, 3 μm, 4 μm, 5 μm, etc. Furthermore, the second light-focusing body 14 may have a maximum size of 1 μm to 5 μm along a thickness direction of the substrate 2. An orthographic projection of each of the second light-focusing bodies 14 on the substrate 2 may be circular, elliptical, rectangular, square, triangular, trapezoidal and polygonal, etc. Certainly, the orthographic projection of each of the second light-focusing bodies 14 on the substrate 2 may also be in an irregular shape. When the orthographic projection of the second light-focusing body 14 on the substrate 2 is circular, the orthographic projection has a diameter of 20 μm to 200 μm, for example, 20 μm, 50 μm, 60 μm, 100 μm, 120 μm, 200 μm, etc. Furthermore, the orthographic projection has a diameter of 20 μm to 30 μm, for example, 20 μm, 22 μm, 25 μm, 26 μm, 28 μm, 30 μm, etc. The second light-focusing bodies 14 may include a transparent ink. Specifically, the second light-focusing bodies 14 may be made of the transparent ink. The second light-focusing bodies 14 may be formed by an ink jet printing process.

As shown in FIG. 8, the second light-focusing bodies 14 may correspond to the sub-pixels 401 of the light emitter 4 respectively. The orthographic projection of the second light-focusing body 14 on the substrate 2 at least partially overlaps the orthographic projection of the corresponding sub-pixel 401 on the substrate 2. Furthermore, the orthographic projection of the sub-pixel 401 on the substrate 2 is located within the orthographic projection of the corresponding second light-focusing body 14 on the substrate 2, namely, the area of the orthographic projection of the sub-pixel 401 on the substrate 2 is less than the area of orthographic projection of the corresponding second light-focusing body 14 on the substrate 2. The orthographic projection of the second light-focusing body 14 on the substrate 2 at least partially overlaps the orthographic projection of the corresponding color resistance block 601 on the substrate 2. Furthermore, the orthographic projection of the color resistance block 601 on the substrate 2 is located within the orthographic projection of the corresponding second light-focusing body 14 on the substrate 2. Further, the orthographic projections of the second light-focusing bodies 14 on the substrate 2 and the orthographic projections of the first light-focusing bodies 8 on the substrate 2 are alternately disposed in a spacing. The orthographic projections of the second light-focusing bodies 14 on the substrate 2 and the orthographic projections of the light-transmitting holes 10 on the substrate 2 are alternately disposed in a spacing.

Figure 11:
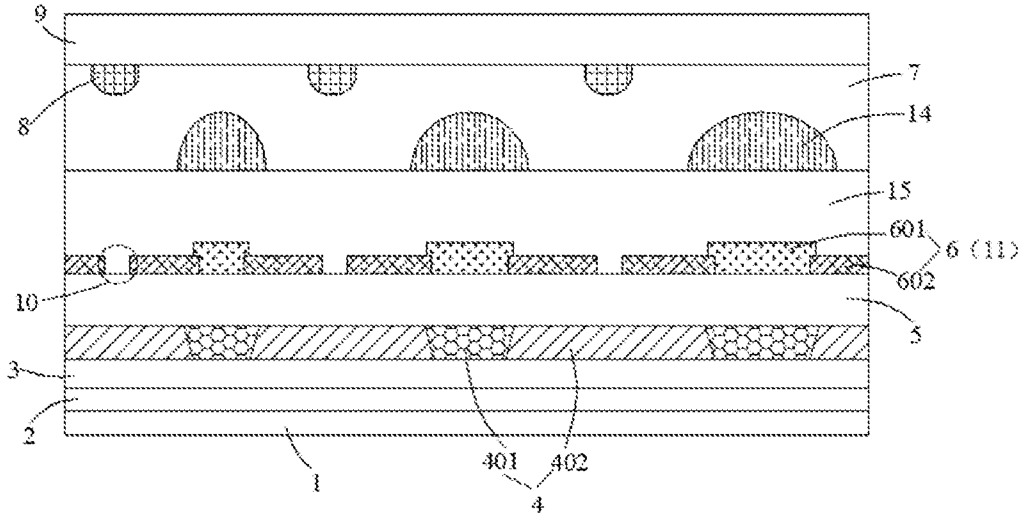
Figure 12:
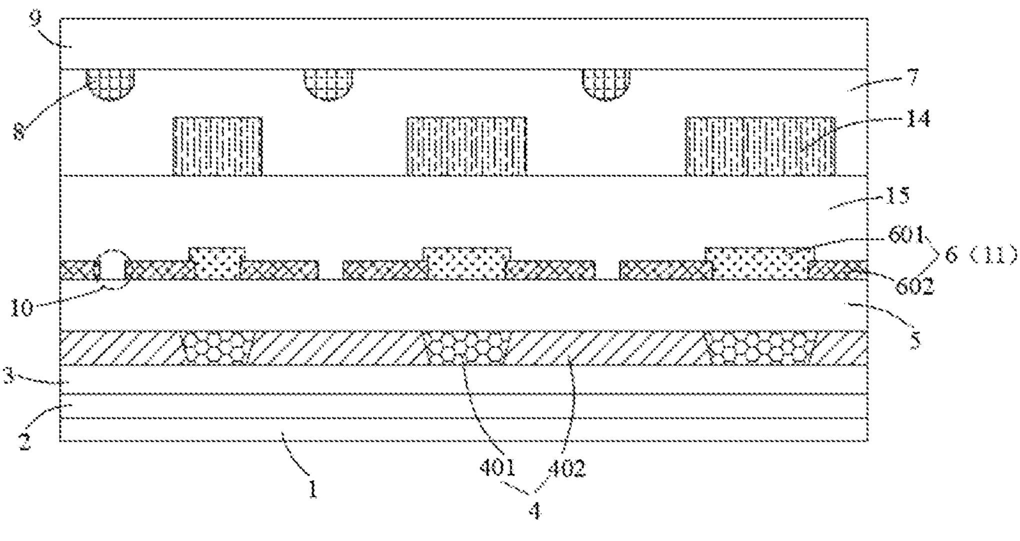
Figure 13:
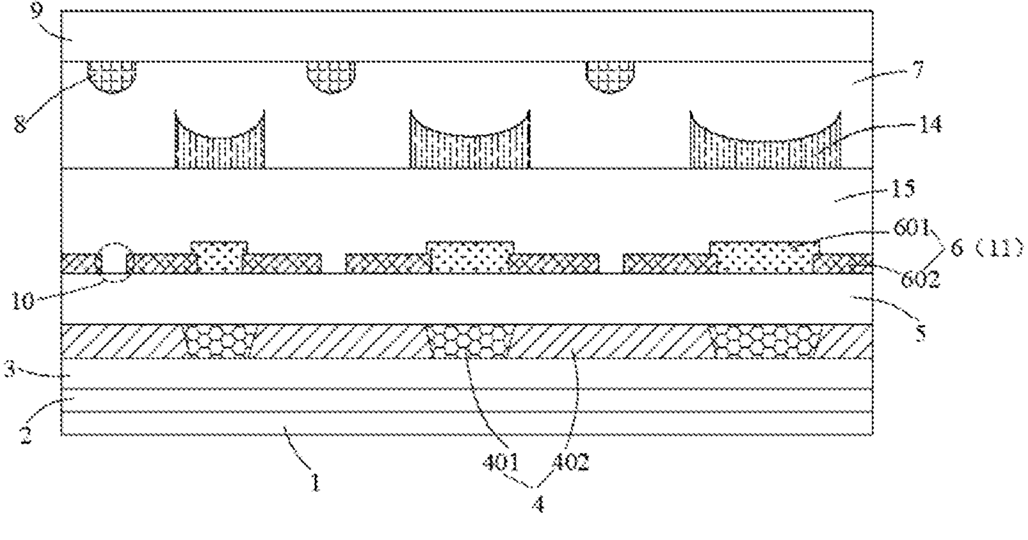

As shown in FIG. 11, the second light-focusing bodies 14 and the first light-focusing bodies 8 may be located on a same side of the light-blocking layer 11, the first light-adjusting layer 7 is located on the light-emitting side of the light emitter 4, and the first light-focusing bodies 8 are at a side of the first light-adjusting layer 7 away from the light emitter 4. The second light-focusing bodies 14 may be at a surface of the first light-adjusting layer 7 facing the light emitter 4, and the refractive index of the first light-adjusting layer 7 is different from the refractive index of the second light-focusing body 14. In an embodiment, a surface of the second light-focusing body 14 facing the first light-adjusting layer 7 is an outwardly-protruding curved surface, namely, the surface of the second light-focusing bodies 14 facing the first light-adjusting layer 7 is protruded to a direction away from the light emitter 4, in other words, a center of curvature of the curved surface is located at a side of the curved surface close to the light emitter 4; and, the refractive index of the first light-adjusting layer 7 is less than the refractive index of the second light-focusing body 14. In another embodiment, as shown in FIG. 13, the surface of the second light-focusing body 14 facing the first light-adjusting layer 7 is an inwardly-recessed curved surface, namely, the surface of the second light-focusing bodies 14 facing the first light-adjusting layer 7 is recessed to a direction close to the light emitter 4, in other words, a center of curvature of the curved surface is located at a side of the curved surface away from the light emitter 4; and, the refractive index of the first light-adjusting layer 7 is greater than the refractive index of the second light-focusing body 14. In other embodiments, as shown in FIG. 12, the surface of the second light-focusing body 14 facing the first light-adjusting layer 7 is a plane or an approximate plane, and the refractive index of the first light-adjusting layer 7 is greater than the refractive index of the second light-focusing bodies 14. Furthermore, as shown in FIGS. 11-13, the display baseplate further includes a planarization layer 15. The planarization layer 15 may be at the light-emitting side of the light emitter 4, and the second light-focusing bodies 14 are disposed at a surface of the planarization layer 15 away from the light emitter 4. The first light-adjusting layer 7 covers the planarization layer 15 and the second light-focusing bodies 14. A surface of the planarization layer 15 away from the first light-adjusting layer 7 may be at a side of the color film layer 6 away from the substrate 2, and covered on the color film layer 6. The planarization layer 15 may be filled in the light-transmitting holes 10 in the color film layer 6.

Figure 9:
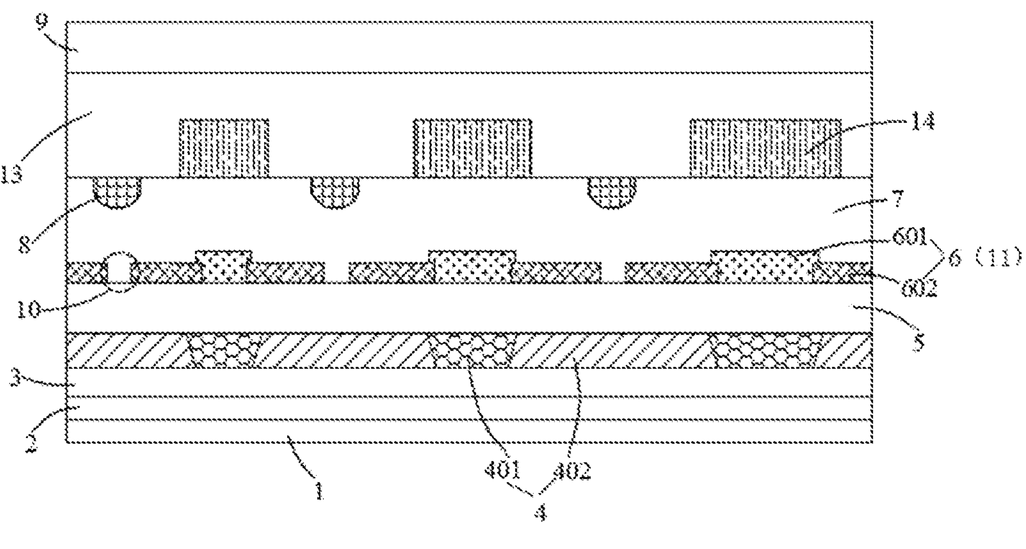
Figure 10:
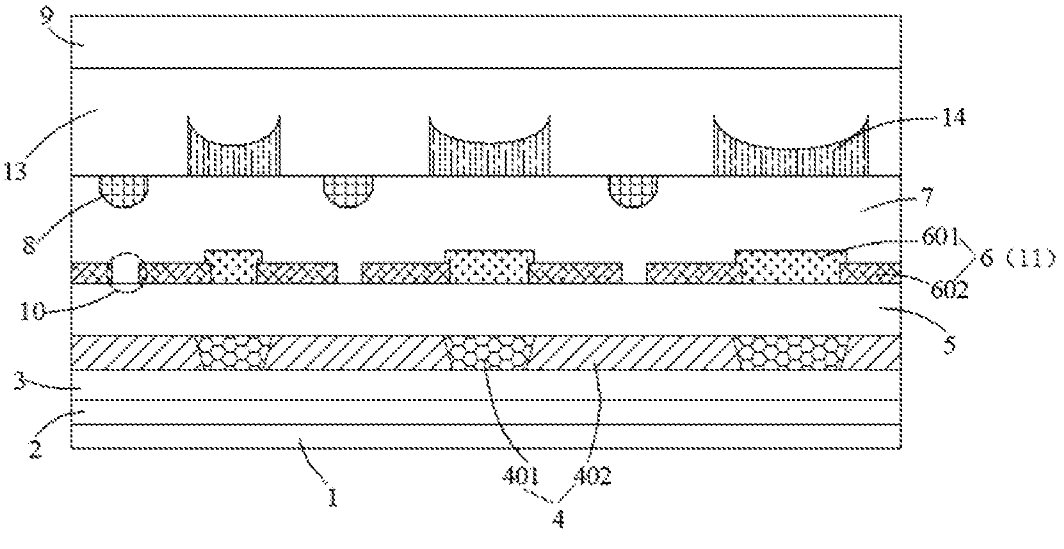

Of course, as shown in FIGS. 8-10, the second light-focusing bodies 14 may also be disposed at a side of the first light-adjusting layer 7 away from the light emitter 4. For example, when the first light-adjusting layer 7 is provided with recesses, the second light-focusing bodies 14 may be disposed in a region outside the recesses on the surface of the first light-adjusting layer 7 away from the light emitter 4. The baseplate in the present disclosure may further include a second light-adjusting layer 13, which covers the first light-adjusting layer 7, the first light-focusing bodies 8 and the second light-focusing bodies 14. The second light-adjusting layer 13 may include a photoresist. Specifically, the second light-adjusting layer 13 is made of the photoresist.

Figure 14:
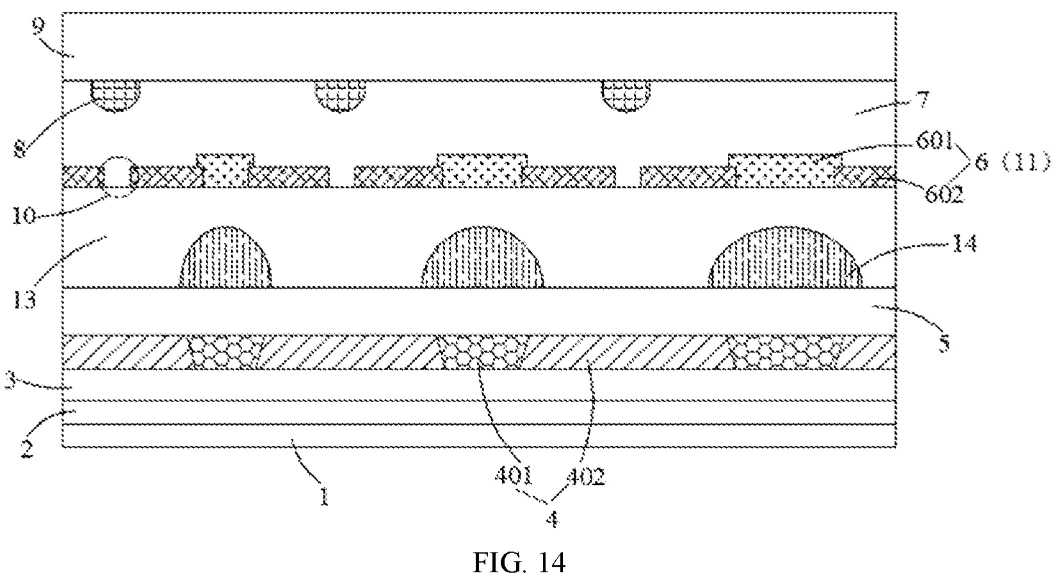
Figure 15:
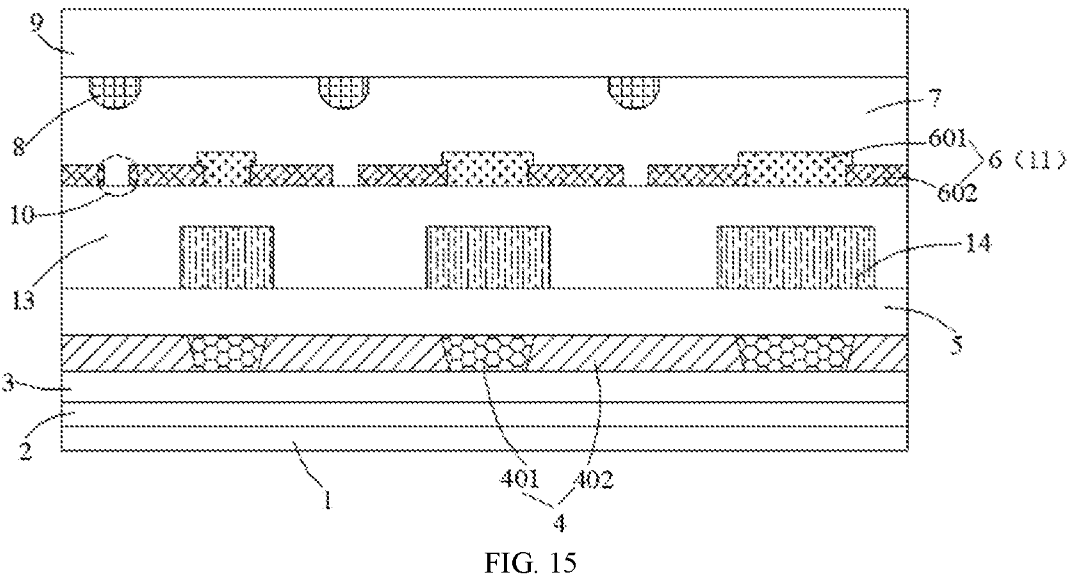
Figure 16:
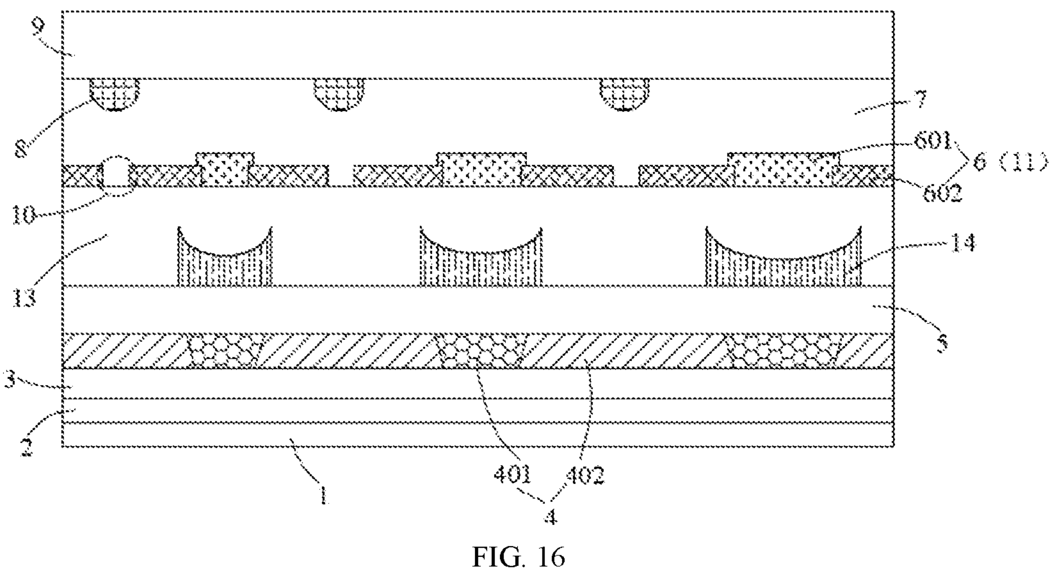

Furthermore, as shown in FIGS. 14-16, the first light-focusing bodies 8 and the second light-focusing bodies 14 may be located at both sides of the light-blocking layer 11 correspondingly one-to-one. For example, the above second light-adjusting layer 13 may be disposed on the light-emitting side of the light emitter 4, and the light-blocking layer 11 may be located on a side of the second light-adjusting layer 13 away from the light emitter 4. The second light-focusing bodies 14 may be at the surface of the second light-adjusting layer 13 facing the light emitter 4.

The above second light-adjusting layer 13 and the above second light-focusing bodies 14 have different refractive indexes. In an embodiment, as shown in FIGS. 8 and 14, the surface of the second light-focusing body 14 facing the second light-adjusting layer 13 is a outwardly-protruding curved surface, namely, the surface of the second light-focusing body 14 facing the second light-adjusting layer 13 is protruded to a direction away from the light emitter 4, in other words, a center of curvature of the curved surface is located at a side of the curved surface close to the light emitter 4; and, the refractive index of the second light-adjusting layer 13 is less than the refractive index of the second light-focusing body 14. In another embodiment, as shown in FIGS. 10 and 16, the surface of the second light-focusing body 14 facing the second light-adjusting layer 13 is an inwardly-protruding curved surface, namely, the surface of the second light-focusing body 14 facing the second light-adjusting layer 13 is recessed to a direction close to the light emitter 4, in other words, a center of curvature of the curved surface is located at a side of the curved surface away from the light emitter 4; and the refractive index of the second light-adjusting layer 13 is greater than the refractive index of the second light-focusing body 14. In other embodiments, as shown in FIGS. 9 and 15, the surface of the second light-focusing body 14 facing the second light-adjusting layer 13 is a plane or an approximate plane, and the refractive index of the second light-adjusting layer 13 is greater than the refractive index of the second light-focusing body 14.

Figure 17:
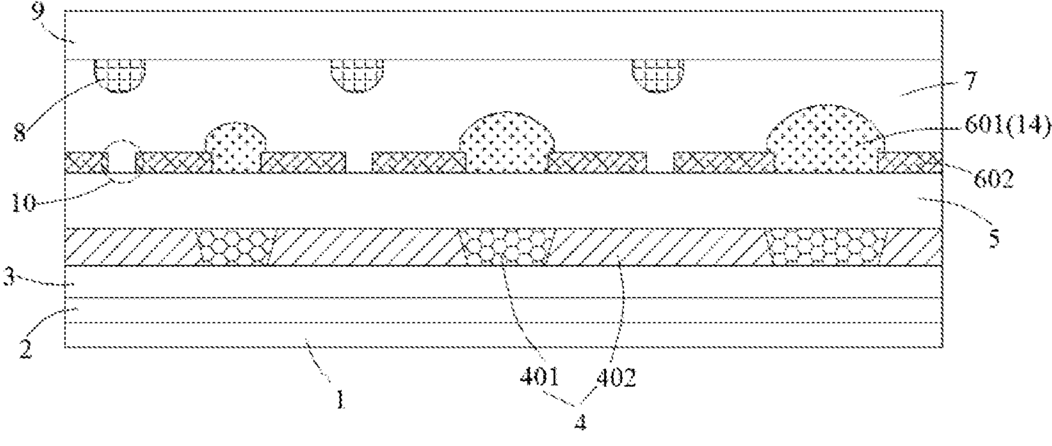

In other embodiments of the present disclosure, as shown in FIG. 17, the second light-focusing bodies 14 may be formed by the color resistance blocks 601. A surface of the color resistance block 601 away from the light emitter 4 is a curved surface, which is protruded to a direction away from the light emitter 4, namely, a center of curvature of the curved surface is located at a side of the curved surface close to the light emitter 4. The above first light-adjusting layer 7 covers the color resistance blocks 601, and the refractive index of each of the color resistance blocks 601 is greater than the refractive index of the first light-adjusting layer 7.

An embodiment of the present disclosure provides a method of manufacturing a display baseplate, which is used to manufacture the display baseplate mentioned in any one of the above embodiments. As shown in FIG. 2, the method may include: providing the substrate 2; forming the light-blocking layer 11 on the substrate 2, where light-transmitting holes 10 are provided with the light-blocking layer 11; forming the first light-adjusting layer 7 on a side of the light-blocking layer 11; forming first light-focusing bodies 8 on a surface of the first light-adjusting layer 7 away from the light-blocking layer 11, where the refractive index of the first light-adjusting layer 7 is different from the refractive index of each of the first light-focusing bodies 8, and the first light-focusing bodies 8 are used to focus light incident to the light-blocking layer 11.

In the method of manufacturing the display baseplate, as shown in FIG. 2, forming the first light-focusing bodies 8 at the surface of the first light-adjusting layer 7 away from the light-blocking layer 11 may include: forming recesses on the surface of the first light-adjusting layer 7 away from the light-blocking layer 11; forming the first light-focusing bodies 8 in the recesses respectively. The recesses may be prepared by a lithography process. The first light-focusing bodies 8 may be prepared by the ink jet printing process.

An embodiment of the present disclosure further provides a display panel. As shown in FIG. 2, the display panel may include a light-sensing device 1 and the display baseplate described in any one of the embodiments herein. The light-sensing device 1 may be at a side of the light-blocking layer 11 away from the first light-adjusting layer 7. The light-sensing device 1 and the light-blocking layer may be located at both sides of the substrate 2, which is not limited herein. The light-sensing device 1 may be a fingerprint identification sensor, a camera, an infrared sensor, a face identification sensor, etc. Since the display baseplate in the display panel of the embodiments of the present disclosure is same as the display baseplate in the embodiments of the display baseplate, the display panel has the same beneficial effects as the display baseplate, and no redundant descriptions are made herein.

An embodiment of the present disclosure further provides a display apparatus, which includes the display baseplate described in any one of the above embodiments. The display apparatus may be a smart phone, a computer, a television, a camera, a wearable display, a navigation device, a vehicle-mounted display, etc., which is not limited herein. Since the display panel in the display apparatus of the embodiments of the present disclosure is same as the display panel in the embodiments of the display panel herein, the display apparatus has the same beneficial effects as the display panel, and no redundant descriptions are made herein.

The above descriptions are made merely to preferred embodiments of the present disclosure rather than intended to limit the present disclosure in any manner. Although the present disclosure is disclosed with preferred embodiments as above, these preferred embodiments are not used to limit the present disclosure. Those skilled in the art may make some changes or modifications to the technical contents of the present disclosure as equivalent embodiments without departing from the scope of the technical solution of the present disclosure. Any simple changes, equivalent changes or modifications made to the above embodiments based on the technical essence of the present disclosure without departing from the contents of the technical solution of the present disclosure shall all fall within the scope of protection of the present disclosure.

The invention claimed is:

1. A display baseplate, comprising:

a substrate;

a light-blocking layer, on the substrate and comprising light-transmitting holes;

a first light-adjusting layer, at a side of the light-blocking layer; and first light-focusing bodies, at a surface of the first light-adjusting layer away from the light-blocking layer, wherein a refractive index of the first light-adjusting layer is different from a refractive index of each of the first light-focusing bodies;

wherein a surface of each of the first light-focusing bodies facing the first light-adjusting layer is a curved surface.

2. The display baseplate of claim 1, wherein the curved surface protrudes toward the light-blocking layer, the refractive index of the first light-adjusting layer is less than the refractive index of each of the first light-focusing bodies, and the first light-focusing bodies are configured to focus light incident to the light-blocking layer.

3. The display baseplate of claim 1, wherein the curved surface is recessed away from the light-blocking layer, and the refractive index of the first light-adjusting layer is greater than the refractive index of each of the first light-focusing bodies.

4. The display baseplate of claim 1, wherein the first light-focusing bodies are in one-to-one correspondence with the light-transmitting holes in position, and an orthographic projection of one of the first light-focusing bodies on the substrate at least partially overlaps an orthographic projection of one of the light-transmitting holes corresponding to the one of the first light-focusing bodies on the substrate.

5. The display baseplate of claim 4, wherein the orthographic projection of the one of the light-transmitting holes on the substrate is located within the orthographic projection of the one of the first light-focusing bodies on the substrate.

6. The display baseplate of claim 1, wherein the first light-focusing bodies are in light-focusing units spaced apart, at least one of the light-focusing units comprises a multiple of the first light-focusing bodies, and the light-focusing units are in one-to-one correspondence with the light-transmitting holes in position.

7. The display baseplate of claim 1, further comprising:

a light emitter, at a side of the substrate, wherein the light-blocking layer is at a side of the light emitter away from the substrate, and the first light-adjusting layer is at a side of the light-blocking layer away from the substrate; and wherein the light-blocking layer comprises a color film layer with color resistance blocks and a black matrix surrounding the color resistance blocks, and the light-transmitting holes are in the black matrix.

8. The display baseplate of claim 7, wherein orthographic projections of the first light-focusing bodies on the substrate and orthographic projections of the color resistance blocks on the substrate do not overlap.

9. The display baseplate of claim 7, wherein the light emitter comprises sub-pixels, and orthographic projections of the first light-focusing bodies on the substrate and orthographic projections of the sub-pixels on the substrate do not overlap.

10. The display baseplate of claim 1, further comprising:

a light emitter, on the substrate; and second light-focusing bodies, on a light-emitting side of the light emitter, and configured to focus light emitted by the light emitter, and orthographic projections of the first light-focusing bodies on the substrate and orthographic projections of the second light-focusing bodies on the substrate do not overlap.

11. The display baseplate of claim 10, wherein the first light-adjusting layer is located at the light-emitting side of the light emitter, and the first light-focusing bodies are at a side of the first light-adjusting layer away from the light emitter; wherein the second light-focusing bodies are at a surface of the first light-adjusting layer facing the light emitter, a surface of each of the second light-focusing bodies facing the first light-adjusting layer is a curved surface protruding away from the light emitter, and the refractive index of the first light-adjusting layer is less than a refractive index of each of the second light-focusing bodies.

12. The display baseplate of claim 11, wherein the light emitter is between the light-blocking layer and the substrate, and the first light-adjusting layer is at a side of the light-blocking layer away from the substrate, and the display baseplate further comprises:

a planarization layer at the light-emitting side of the light emitter, wherein the second light-focusing bodies are at a surface of the planarization layer away from the light emitter, and the first light-adjusting layer covers the planarization layer and the second light-focusing bodies; and wherein the light-blocking layer comprises a color film layer with color resistance blocks and a black matrix surrounding the color resistance blocks, and the light-transmitting holes are in the black matrix;

wherein the planarization layer covers the color film layer.

13. The display baseplate of claim 10, wherein the first light-adjusting layer is at the light-emitting side of the light emitter, and the first light-focusing bodies are at a side of the first light-adjusting layer away from the light emitter; wherein the second light-focusing bodies are at a surface of the first light-adjusting layer facing the light emitter, and the refractive index of the first light-adjusting layer is greater than a refractive index of each of the second light-focusing bodies; and a surface of each of the second light-focusing bodies facing the first light-adjusting layer is a plane or a curved surface recessed toward the light emitter.

14. The display baseplate of claim 10, wherein the first light-adjusting layer is at the light-emitting side of the light emitter, and the first light-focusing bodies and the second light-focusing bodies are at a side of the first light-adjusting layer away from the light emitter; wherein the display baseplate comprises a second light-adjusting layer, covering the first light-adjusting layer, the first light-focusing bodies and the second light-focusing bodies;

wherein a surface of each of the second light-focusing bodies facing the second light-adjusting layer is a curved surface protruding away from the light emitter, and a refractive index of the second light-adjusting layer is less than a refractive index of each of the second light-focusing bodies.

15. The display baseplate of claim 10, wherein the first light-adjusting layer is at the light-emitting side of the light emitter, and the first light-focusing bodies and the second light-focusing bodies are at a side of the first light-adjusting layer away from the light emitter; wherein the display baseplate comprises:

a second light-adjusting layer, covering the first light-adjusting layer, the first light-focusing bodies and the second light-focusing bodies; wherein a refractive index of the second light-adjusting layer is greater than a refractive index of each of the second light-focusing bodies;

wherein a surface of each of the second light-focusing bodies facing the second light-adjusting layer is a plane or an approximate plane; or, a curved surface recessed toward the light emitter.

16. The display baseplate of claim 10, wherein the first light-focusing bodies and the second light-focusing bodies are located at both sides of the light-blocking layer correspondingly one-to-one in position, wherein the display baseplate further comprises a second light-adjusting layer at the light-emitting side of the light emitter, and the light-blocking layer is at a side of the second light-adjusting layer away from the light emitter;

wherein the second light-focusing bodies are at a surface of the second light-adjusting layer facing the light emitter, a surface of each of the second light-focusing bodies facing the second light-adjusting layer is a curved surface protruding away from the light emitter, and a refractive index of the second light-adjusting layer is less than a refractive index of each of the second light-focusing bodies.

17. The display baseplate of claim 10, wherein the first light-focusing bodies and the second light-focusing bodies are located at both sides of the light-blocking layer correspondingly one-to-one in position, and the display baseplate comprises a second light-adjusting layer at the light-emitting side of the light emitter, wherein the light-blocking layer is at a side of the second light-adjusting layer away from the light emitter;

wherein the second light-focusing bodies are at a surface of the second light-adjusting layer facing the light emitter, and a refractive index of the second light-adjusting layer is greater than a refractive index of each of the second light-focusing bodies;

wherein a surface of each of the second light-focusing bodies facing the second light-adjusting layer is a plane or an approximate plane; or, a curved surface recessed toward the light emitter.

18. A display panel, comprising:

the display baseplate of claim 1; and a light-sensing device, at a side of the light-blocking layer away from the first light-adjusting layer.

19. A display apparatus, comprising the display panel of claim 18.

* * * * *